United States Patent [19]

Tanimura et al.

[11] 4,005,468
[45] Jan. 25, 1977

[54] SEMICONDUCTOR PHOTOELECTRIC DEVICE WITH PLURAL TIN OXIDE HETEROJUNCTIONS AND COMMON ELECTRICAL CONNECTION

[75] Inventors: Shigeru Tanimura, Kyoto; Nobuaki Miura; Mikizo Miyamoto, both of Nagaokakyo, all of Japan

[73] Assignee: Omron Tateisi Electronics Co., Kyoto, Japan

[22] Filed: Apr. 3, 1973

[21] Appl. No.: 347,427

[30] Foreign Application Priority Data

Apr. 4, 1972 Japan .............................. 47-34174
Sept. 30, 1972 Japan .............................. 47-98248

[52] U.S. Cl. .................................. 357/15; 357/13; 357/17; 357/19; 357/30; 357/32; 148/175
[51] Int. Cl.² ................ H01L 29/90; H01L 33/00; H01L 31/12; H01L 27/14
[58] Field of Search .... 317/235 UA, 235 Z, 235 N, 317/235 R, 238; 357/15, 13, 38, 17, 19, 30, 32; 148/175

[56] References Cited

UNITED STATES PATENTS

| | | | |
|---|---|---|---|
| 3,106,489 | 10/1963 | Lepselter | 317/234 L |
| 3,381,183 | 4/1968 | Turner et al. | 317/235 Z |
| 3,391,282 | 7/1968 | Kabell | 317/235 N |
| 3,416,044 | 12/1968 | Drexfus et al. | 317/234 R |
| 3,541,679 | 11/1970 | Mandelkorn | 317/235 N |
| 3,553,541 | 1/1971 | King | 317/235 Z |
| 3,566,217 | 2/1971 | Cooper | 317/235 R |
| 3,596,151 | 7/1971 | Eldridge | 317/235 UA |
| 3,622,844 | 11/1971 | Barelli | 317/235 U |
| 3,636,418 | 1/1972 | Burns et al. | 357/32 |
| 3,679,949 | 7/1972 | Uekusa et al. | 317/238 |
| 3,698,941 | 10/1972 | Nobel et al. | 317/235 U |
| 3,755,752 | 8/1973 | Kim | 317/234 G |
| 3,760,240 | 9/1973 | Bergt | 317/235 N |
| 3,806,779 | 4/1974 | Uekusa et al. | 357/71 |
| 3,872,490 | 3/1975 | Higashi et al. | 357/15 |

OTHER PUBLICATIONS

Metal–Dependent Interface States in Thin MOS Structures; by S. Kar et al.; Applied Physics Letters vol. 18, No. 9, May 1, 1971 pp. 401–403.
Metal–Silicon Shottky Barriers; by Turner et al.; Solid State Electronics; Mar. 1968; vol. 11, No. 3, pp. 291–300.

*Primary Examiner*—Andrew J. James

[57] ABSTRACT

A semiconductor photoelectric device of improved photoelectric and rectifying characteristics is provided by first forming a film of electrically insulating material such as silicon dioxide of a substantial thickness on a main surface of a semiconductor substrate so as to have a plurality of portions of said main surface exposed through a corresponding plurality of square or rectangle openings laid out at right angles, said openings being defined by said insulating material film, depositing a tin oxide film on the open areas of the semiconductor substrate, removing a portion of said tin oxide film just overlying the said insulating film for separating the respective barrier regions formed between the tin oxide film and the substrate, and providing a metal layer on said insulating film for connecting the end portion of the tin oxide film of the adjacent barrier regions. The resultant photoelectric device, even if a total light receiving area is increased, shows an improved photoelectric characteristic at low and high illumination.

42 Claims, 15 Drawing Figures

SEMICONDUCTOR PHOTOELECTRIC DEVICE WITH PLURAL TIN OXIDE HETEROJUNCTIONS AND COMMON ELECTRICAL CONNECTION

BACKGROUND OF THE INVENTION

1. Field of the Invention

The present invention relates to a semiconductor photoelectric device, and more specifically to an improved semiconductor photoelectric device utilizing a semiconductor composite comprising a tin oxide film deposited on a semiconductor substrate and having a rectifying characteristic.

2. Description of the Prior Art

One of the typical existing photoelectric devices made of semiconductor materials is a silicon photoelectric device. As is well known, the silicon photoelectric device is manufactured by forming a P-type diffused layer of a thickness of a few microns or less on the surface of an N-type silicon substrate so that when the light impinges on the P-N junction formed therebetween, photovoltaic energy is generated between the P-type layer and the N-type layer. Also it is well known that the conductivity type of the respective layers may be reversed depending upon the application.

However, this type of silicon photoelectric device is disadvantageous in that the device is expensive as compared with other types of photoelectric devices, such as cadmium sulfide photoelectric devices, mainly because manufacture of the silicon photoelectric devices necessitates a diffusion process which should be carried out at a high temperature and under a carefully controlled condition. Another disadvantage of silicon photoelectric device is that it is of less sensitivity in a short wavelength region of spectral characteristic thereof due to the fact that light energy stronger than the band energy limit of the semiconductor does not transmit through the semiconductor to the P-N junction which usually formed at a substantial distance below the surface of the semiconductor. Thus, it is essential to make the abovementioned diffused layer extremely thin, preferably as thin as 0.3 micron in order to implement such a device sufficiently sensitive to a shorter wavelength region as well. Nevertheless, formation of a thin diffused layer calls for a high level of diffusion techniques, again resulting in a high cost of this type of device.

If the diffused layer of such silicon photoelectric device could be replaced with a transparent conductive film of metal oxide and if such film could serve the same function as that of the diffused layer, the cost of manufacturing a photoelectric device would be greatly reduced and the resultant device could have a greater scope of application. One of the prior arts of interest in this connection is U.S. Pat. No. 3,679,949, entitled "SEMICONDUCTOR HAVING TIN OXIDE LAYER AND SUBSTRATE", issued July 25, 1972 to Genzo Uekusa et al. and assigned to the same assignee of the present invention. The referenced patent basically discloses a semiconductor composite comprising a film of tin oxide ($SnO_2$) deposited on a semiconductor substrate such as silicon and having a rectifying and photoelectric characteristic therebetween.

More specifically, the referenced patent discloses such composite obtained by a process comprising the steps of heating an N-type silicon single crystal substrate in a quartz tube, and introducing a vapor of a tin salt such as dimethyl tin dichloride (($CH_3)_2SnCl_2$) into said quartz tube for depositing a tin oxide film on said silicon substrate by pyrolysis. Such composite comprises a barrier formed between the tin oxide film and the silicon substrate, which barrier is presumably a Schottky barrier and closely resembles a P-N junction in a rectifying characteristic. Such barrier may be advantageously utilized as a rectifying device or photoelectromotive force device. As is well known, the tin oxide film is transparent and conductive. Hence, by so adapting the composite that the light is applied to said barrier through the tin oxide film, a photoelectric device is provided. The spectral response characteristic of such photoelectric device is such that it is more highly sensitive in the visible wavelength region as compared with a conventional silicon photoelectric device. It also exhibits a higher output at lower illumination, and is satisfactory in temperature characteristic and response characteristic. Another advantage of the referenced patent composite is that the composite can be provided with ease and less cost on a mass production basis in view of the fact that the tin oxide layer may be deposited at a lower temperature as compared with a process employed in manufacture of the silicon photoelectric device.

Preferably silicon is employed as a semiconductor substrate material in manufacturing the referenced patent composite. It should be pointed out, however, that the surface of the silicon substrate is likely to be oxidized even at a normal temperature and as a result the silicon substrate as prepared for manufacture of semiconductor devices usually comprises a thin oxide film formed on the surface thereof. Such oxide film typically comprises $SiO_2$. Again it should be pointed out that an additional oxide film is formed on the surface of the substrate in the course of further depositing a tin oxide film on the surface. As a result it was found that the semiconductor composite prepared in accordance with the teaching in the said referenced patent usually comprises a very thin insulating film, typically of $SiO_2$, of a thickness of a few A to approximately 10 A incidentally formed between the tin oxide film and the substrate. Thus it would be readily understood that such undesired intervening layer of insulating film is inevitably formed, unless consideration is given to eliminate such undesired layer.

With a view to investigating in detail what influence the $SiO_2$ layer incidentally formed between the $SnO_2$ layer and the Si substrate has upon performance of the $SnO_2$-Si heterojunction of the composite, an experiment was carried out, in which removal was first made of the $SiO_2$ layer formed on the substrate surface through natural oxidization of the substrate material and then deposition was made of an $SnO_2$ layer on the fresh surface of the substrate by a process and a means for eliminating formation of an $SiO_2$ layer on the substrate surface during deposition of the $SnO_2$ layer, so that a new composite can be provided, which comprises no substantial $SiO_2$ layer between the $SnO_2$ layer and the substrate of the composite. As a result, it was observed that the resultant $SnO_2$-Si composites are non-uniformity in a reverse breakdown voltage, are of an increased reverse leakage current and of a lowered reverse breakdown voltage. As well known to those skilled in the art, these changes in characteristics with respect to the referenced patent composite are all disadvantageous in various applications of the semiconductor device. Thus the fact was confirmed that formation of the $SiO_2$ film at a junction region of the $SnO_2$-Si composite has substantial influence upon the characteristic of the semiconductor device.

Nevertheless, the fact was also confirmed by experiment that the thickness of the SiO$_2$ film incidentally formed in the SnO$_2$-Si composite manufactured in accordance with the teaching in the referenced patent does not exceed 15 A. It is believed that usually such a very thin SiO$_2$ layer does not cover the whole surface of the silicon substrate or rather the substrate surface is studded with a plurality of small SiO$_2$ film areas with irregularities of the film thickness and other film conditions. For this reason it is hardly possible to provide SnO$_2$-Si composites of uniformity in characteristics as a semiconductor device, resulting in an unsatisfactory yield rate of manufacture of the device.

Another semiconductor photoelectric device of interest, which has a different structural feature, is disclosed in United States Patent Application, Ser. No. 304,809, entitled "SEMICONDUCTOR DEVICE", filed Nov. 8, 1972 by Shigeru Tanimura et al. and assigned to the same assignee of the present invention. Briefly stated, the referenced application discloses a semiconductor composite comprising a semiconductor substrate, an insulating film formed on said semiconductor substrate and a film of a tin oxide, preferably stannic oxide (SnO$_2$), deposited on said insulating film and having a rectifying characteristic. Preferably a material of said semiconductor substrate may be selected from the group consisting of Si, Ge and GaAs. Preferably a material of said insulating film may be selected from the group consisting of SiO$_2$, Si$_3$N$_4$ and GeO$_2$. A thickness of the insulating film may be chosen to be 15 A to 500 A, but preferably a thickness of the insulating film may be chosen to be 27 A to 300 A and more preferably 27 A to 100 A.

Such a composite can be used as an ordinary rectifier without any incidental radiation energy and, with its SnO$_2$ layer as a light receiving side, can be used as a photoelectric device. However, other applications of the referenced application are a voltage controlled switching device and a light controlled switching device. More specifically, it was discovered that the composite, as subjected to radiation energy of a certain value, if a thickness of the SiO$_2$ film is chosen to be a particular value range, say 27 A to 500 A, shows an excellent voltage response to a reverse bias voltage applied to the composite. Thus, the composite as subjected to a predetermined value of radiation energy may be used as a switching device which is operable as a function of the voltage applied to the composite in a reverse direction. It was also discovered that the composite as supplied with a certain value of a reverse bias voltage or with no bias, if a thickness of the SiO$_2$ film is chosen to be a particular value range, say 27 A to 500 A, shows an excellent radiation response in a reverse current to radiation energy applied to the composite. Thus, the composite may be used as a switching device which is operable as a function of the radiation energy applied to the composite.

One of the most advantageous features of the devices disclosed in the referenced patent and the referenced patent application as compared with the conventional silicon photoelectric devices is that the referenced photoelectric device comprising an SnO$_2$-Si composite or SnO$_2$-SiO$_2$-Si composite shows a remarkably improved photosensitivity even at low illumination, while such photoelectric device can also respond to illumination higher than the limit to the conventional silicon P-N junction device. More specifically, the referenced photoelectric device can respond to illumination of a range from as low as 10$^{-3}$ lux to as high as 100,000 lux, while the conventional silicon P-N junction device can only cover an illumination range from 10$^{-2}$ lux to 30,000 lux at the best. In particular, good use could be made of high sensitivity at low illumination of the referenced device.

In some applications of the referenced prior art device, it is often required to provide a device capable of generating an output current of a sufficient value. For this purpose, those skilled in the art might simply think of implementing a composite of an increased light receiving barrier area. As a result of experimentation, however, it was found that in the referenced prior art composite an increase of the barrier area in a single light receiving region does not bring a linearly proportional reverse dark current but rather causes a much more increased reverse dark current than ordinarily expected. It was also found that a light current in terms of unit area of the composite subjected to illumination is decreased, possibly because of an increased series resistance across the increased barrier area. Thus it was observed that a signal-noise ratio of the referenced prior art composite is decreased, as the barrier area for light receipt in a single region is increased. Such a disadvantage is particularly aggravated in utilizing the composite at low illumination.

SUMMARY OF THE INVENTION

Briefly stated, the present invention provides a semiconductor photoelectric device comprising a plurality of films of tin oxide deposited on a semiconductor substrate, with spacing between the adjacent tin oxide films, each tin oxide film forming a heterojunction barrier, connection means for connecting the adjacent tin oxide films for providing an electrically common electrode of the tin oxide films, and means for withdrawing an electrical output therefrom.

In a preferred embodiment, the respective barrier regions are defined and confined by an electrically insulating film deposited on the substrate and extending underneath the said spacing, and the said connection means is formed on the insulating film. This film of insulating material protects the said barrier from being broken by the process of photo-etching the SnO$_2$ film for providing the said spacing and also by the process of depositing the said connection means.

As a result, the present invention provides a semiconductor photoelectric device of an increased light receiving barrier area, which has improved characteristic at both low and high illumination and at a low or no bias voltage to the device.

Therefore, an object of the present invention is to provide a semiconductor photoelectric device having improved characteristics which comprises an SnO$_2$ film deposited on a semiconductor substrate and has a heterojunction barrier.

Another object of the present invention is to provide a semiconductor photoelectric device having an improved photoelectric characteristic at low and high illumination which comprises an SnO$_2$ film deposited on a semiconductor substrate and has a heterojunction barrier.

A further object of the present invention is to provide a semiconductor photoelectric device comprising an SnO$_2$ film deposited on a semiconductor substrate and having a heterojunction barrier for generating an increased electrical output current with less degradation of the characteristic.

An aspect of the present invention is to decrease a tensile force exerted across an $SnO_2$ film of a semiconductor photoelectric device of an increased light receiving barrier area comprising an $SnO_2$ film deposited on a semiconductor substrate and having a heterojunction barrier, thereby decreasing a shearing stress applied to the barrier and improving a photoelectric characteristic at low illumination.

Another aspect of the present invention is to decrease series resistance across an $SnO_2$ film of a semiconductor photoelectric device of an increased light receiving area comprising an $SnO_2$ film deposited on a semiconductor substrate and having a heterojunction barrier, thereby improving a photoelectric characteristic at high illumination.

A further aspect of the present invention is to provide a semiconductor photoelectric device usable either as a voltage control switching device or as a radiation switching device and comprising a semiconductor substrate having a main surface with an insulating layer comprising a semiconductor reaction product formed on the main surface and a $SnO_2$ film formed on the insulating layer and particularly wherein a further insulating layer formed in a grid-type configuration is formed on the first mentioned insulating layer thereby to provide a plurality of the $SnO_2$ films in the spacings defined by the said grid and forming a corresponding plurality of heterojunction barriers and with a metal conducting layer formed on the grid to provide an electrically common connection to the separate tin oxide films, the resulting structure generating an increased electrical output current with improved characteristics.

These and other objects, aspects and features of the present invention will be better understood from the following detailed description in conjunction with the accompanying drawings.

BRIEF DESCRIPTION OF THE DRAWINGS

In all these Figures like reference characters designate like parts.

DESCRIPTION OF THE PREFERRED EMBODIMENTS

Figure 1:
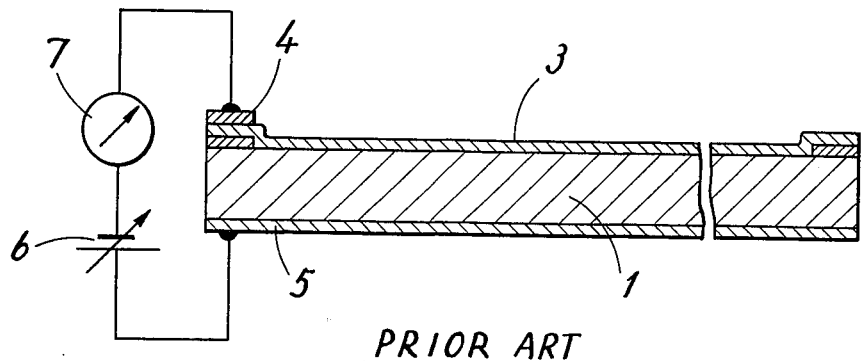
FIG. 1 is a sectional view of a prior art semiconductor composite, which constitutes the basis of the present invention.

Referring to FIG. 1, there is shown a sectional view of a semiconductor composite disclosed in the referenced patent, which constitutes the basis of the present invention. The composite shown basically comprises an N-type single crystal silicon substrate 1 with specific resistivity of 1 ohm cm, and a layer 3 of tin oxide or stannic oxide ($SnO_2$) deposited on the said substrate 1. The composite is also shown comprising a metal electrode 4 formed on the $SnO_2$ layer 3, a metal electrode 5 formed on the substrate 1 and a circuit connection, including an ammeter 7 and a reverse bias voltage source 6 connected to both electrodes 4 and 5. The $SnO_2$ layer of the composite is so chosen as to be well conductive and constitutes itself an N-type semiconductor. The conductivity of this $SnO_2$ layer is close to that of a metal, say about $10^{20}$ atoms/cm$^3$ in terms of free electron concentration. The $SnO_2$ layer 3 having the characteristic of N-type semiconductor can be formed by a rapid chemical reaction yielding $SnO_2$. This is presumably accounted for by the excess of metal or shortage of oxygen resulting from the rapidity of the progress of reaction.

As more fully described in the referenced patent, it was discovered that a composite of such structure and composition has a rectifying characteristic and that such composite takes on a photoelectric function when radiation energy is supplied to the heterojunction formed inside the composite. One of possible interpretations of the discovery is that said formation of heterojunction is actually formation of a Schottky barrier between said $SnO_2$ film 3 and the semiconductor substrate 1, with $SnO_2$ being regarded as a metal.

The previously referenced patent application discloses a similar composite, which further comprises a layer of silicon dioxide ($SiO_2$) formed between the said $SnO_2$ layer 3 and the substrate 1. As more fully described in the referenced application, it was also discovered that the composite has similar rectifying and photoelectric characteristics, provided that a thickness of the $SiO_2$ layer is chosen to be a specified value range, as depicted in brief previously and in more detail in the referenced application.

Figure 2:
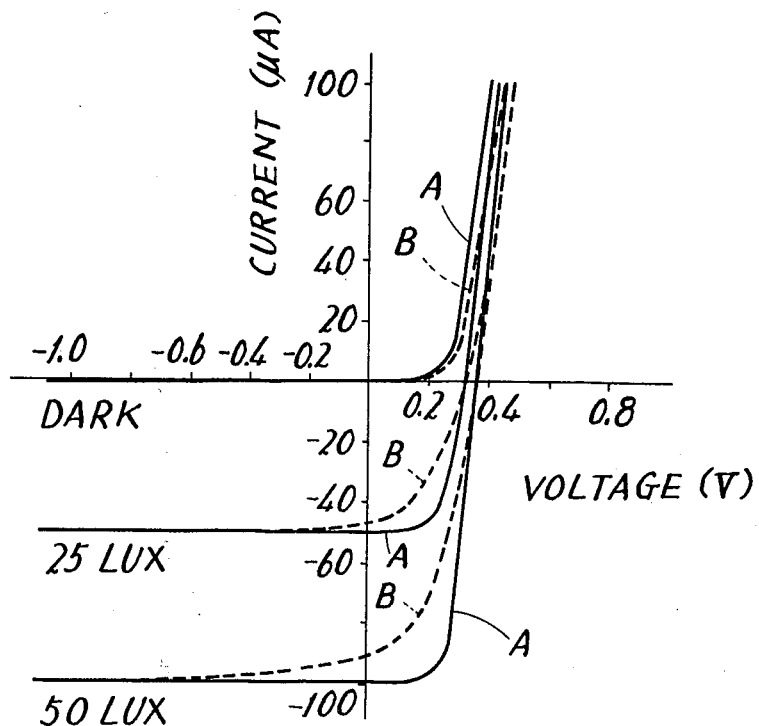
FIG. 2 is a graph showing rectifying and photoelectric characteristics of the prior art semiconductor composite and the inventive semiconductor composite.

FIG. 2 is a graph showing rectifying and photoelectric characteristics of the prior art composite of a relatively increased light receiving barrier area, subjected to various values of illumination, these being shown as a parameter in FIG. 2. Curves B as indicated in dotted lines represent rectifying and photoelectric characteristics of the prior art composite. It is to be pointed out that FIG. 2 also shows rectifying and photoelectric characteristics of the device in accordance with the present invention, as to be more fully described subsequently. Curves A as indicated in solid lines represent rectifying and photoelectric characteristics of the inventive device and therefore this graph will be referred to again subsequently in conjunction with description of the inventive device. As seen from the graph, the prior art composite of an increased light receiving barrier area, as not biased at all or biased with a small value, has a degraded photosensitive characteristic. This is of great problem in that the composite of this type is usually used as not biased at all in various applications.

As discussed in brief in the foregoing, the inventors of the present invention discovered the fact that the prior art composite shows an undesirably more increased reverse dark current rather than a linearly proportional reverse dark current, as a barrier area in a single light receiving region is increased.

Figure 3:
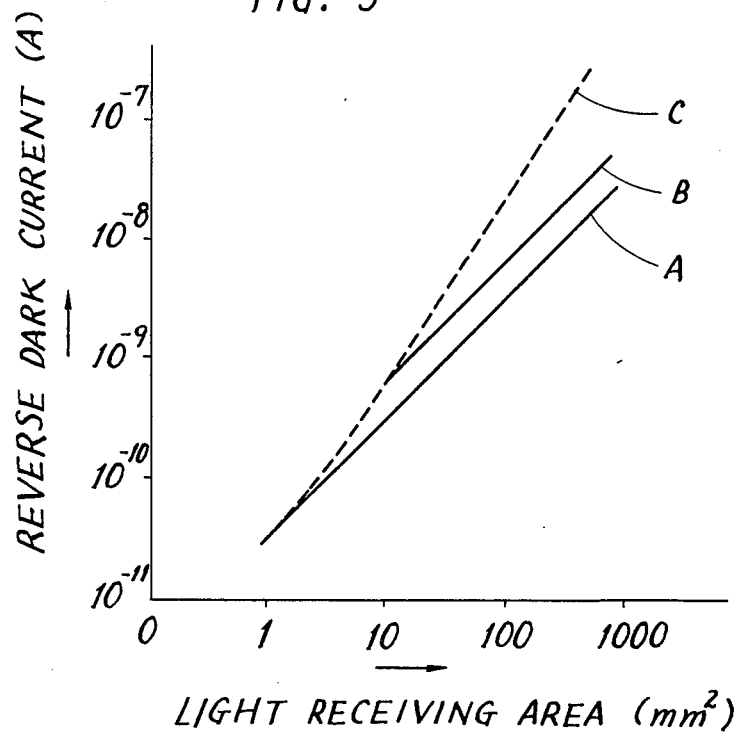
FIG. 3 is a graph showing a relation between a reverse dark current and a light receiving area of the prior art composite and the inventive composite.

FIG. 3 is a graph showing a relation between a reverse dark current and a light receiving area of the prior art composite. Curve C as indicated in a dotted line represents such a relation of the prior art composite. Again it should be pointed out that FIG. 3 also shows such a relation of the device in accordance with the present invention, as to be more fully described subsequently. Curves A and B indicated in solid lines represent the relation of the inventive device and therefore this graph is also referred to again in the following description. As seen from the graph in FIG. 3, it was observed that the prior art composite of an increased light receiving barrier area shows a much more increased reverse dark current and, to be exact, the reverse dark current of the prior art composite is increased in approximate proportion to a square root of the third power of the barrier area, as a light receiving barrier area in a single region is increased.

The fact was also observed that a composite in accordance with the teaching in the referenced patent application shows characteristics similar to the abovementioned ones of the referenced patent composite. If it would be possible to provide a new photoelectric device wherein the abovementioned shortcomings have been eliminated, such a photoelectric device could be used in new and various applications. The present invention provides such a new photoelectric device.

Study was made by experiment by the inventors as to what causes such shortcomings in the prior art composite. As a result, the following reason is presumed as a reason of the said undesirably increased reverse dark current of the large barrier area composite. The inventors noticed that a coefficient of thermal expansion of the $SnO_2$ layer 3 is larger than that of the silicon monocrystalline substrate 1. As to be more fully described in the referenced patent and the referenced patent application, the $SnO_2$ layer 3 is deposited on the substrate surface through thermal decomposition of halogenated organic tin at an elevated temperature and the resultant composite is then cooled off to a normal temperature in the process of manufacture thereof. It is therefore believed that tensile force is exerted across the $SnO_2$ layer in the resultant composite and the broader the $SnO_2$ layer is formed, the larger the said tensile force is generated in the layer. As a result, it is apparent that a shearing stress is exerted at the barrier portion between the $SnO_2$ layer and the substrate, which causes an increased reverse dark current to flow. In fact, experimentation has shown that intentional application of the shearing stress at the barrier portion of the composite causes the reverse leakage current to increase. Thus it is presumed that a more increased barrier area of the composite results in a much more increased reverse dark current.

The referenced patent and the referenced patent application teach and disclose formation of the electrode for the $SnO_2$ layer only at a limited area such as a small area of the peripheral portion of the $SnO_2$ layer. Therefore, an increase of the light receiving barrier area accordingly increases series resistance through the layer to the electrode due to an increased current path length. This apparently causes decrease of the photoelectric characteristic of the large barrier area composite, as not biased. Thus, in order to improve the photoelectric characteristic of the large barrier area composite, a certain consideration is necessary to the structure of the composite. The present invention was accomplished in view of the abovementioned circumstances.

Now referring to FIGS. 4A through 4E, there are shown sectional views of a semiconductor composite at several stages of a process for manufacturing the semiconductor photoelectric device of the present invention, on the basis of the composite as disclosed in the referenced patent. It is apparent that substantially the same photoelectric device of the present invention can also be implemented, on the basis of the composite as disclosed in the referenced patent application, by simply employing an additional step for depositing an insulating layer in accordance with the teaching in the referenced patent application. Therefore, the following description should not be construed by way of limitation.

Figure 4A:
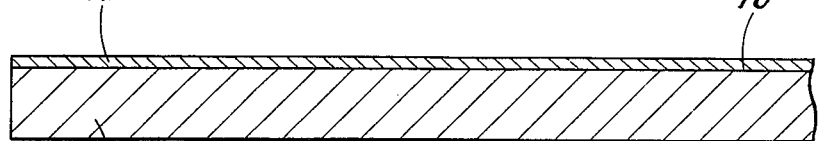
FIGS. 4A through 4E are sectional views of a semiconductor composite at several stages of a process for manufacturing the semiconductor photoelectric device of the present invention.

Referring to FIG. 4A, there is formed a film of insulating material 12 such as of $SiO_2$ on a main surface of an N-type silicon single crystal substrate 11 with specific resistivity of about 1 ohm cm to a thickness of 8,000 A. Said semiconductor substrate 11 can be a combination of an N-type layer of high specific resistivity deposited on another N-type layer of low specific resistivity. Said $SiO_2$ film 12 can be formed by either a known method of thermal reaction or pyrolysis of silane at a relatively low temperature. Such a method of forming an electrically insulating film is well known to those skilled in the art. A film of any other insulating material can be used in place of said $SiO_2$ film. Other such insulating materials are, for example, silicon nitride ($Si_3N_4$), lead glass ($SiO_2$-PbO), and alumina glass ($SiO_2$-$Al_2O_3$).

Figure 4B:
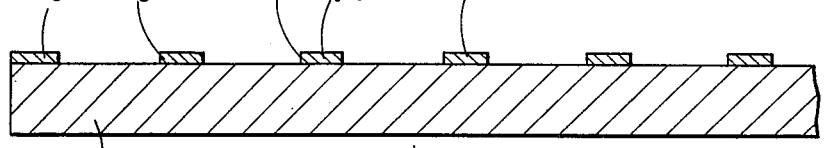

Then, as shown in FIG. 4B, a part of the insulating film 12 is removed by photo-etching for providing a plurality of square openings 16, with the remaining strip portions 17, 18 of the film 12 being laid out at right angles. It is well known to those skilled in the art that films of $SiO_2$, $SiO_2$-PbO and the like can be processed by a photo-etching process with a high degree of precision. Preferred dimension of the openings 16 and the remaining strip portions 17, 18 will be discussed subsequently.

Figure 4C:
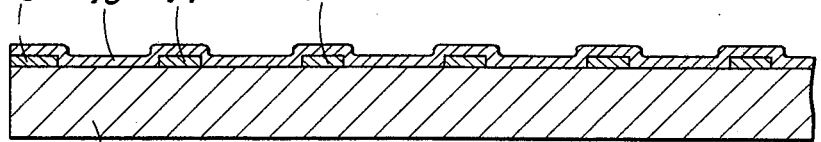

At the next stage, as shown in FIG. 4C, a tin oxide film 13 is formed all over the main surface containing the insulating films 17, 18 to provide a semiconductor composite. This is accomplished by first heating the semiconductor substrate 11 to about 500° C in a quartz reaction tube (not shown) and then introducing a vapor containing tin into said reaction tube for depositing a tin oxide film 13 by pyrolysis on the substrate 11. For the purpose of this reaction, dimethyl tin dichloride (($CH_3$)$_2$$SnCl_2$) can be used. This compound was found to be most preferable. It is, however, also possible to use an aqueous solution of tin tetrachloride ($SnCl_4$) or its solution in an organic solvent.

As a carrier gas an oxidizing atmosphere such as air, oxygen can be used. The tin oxide film 13 can be deposited to a thickness of about 7,000 A by conducting said pyrolytic reaction for 60 sec. For improving the conductivity of the film 13 said reaction source material was admixed with about 0.5 weight percent of antimony oxide ($Sb_2O_3$).

It has been found that an N-type silicon semiconductor is a suitable material for the substrate of said composite. However, a semiconductor composite of the like rectifying characteristic was also able to be implemented by the use of a P-type silicon semiconductor. In using a P-type material, however, it was found to be preferable to carry out the $SnO_2$ deposition reaction at a somewhat higher temperature or to give a proper heat treatment to the composite made by $SnO_2$ deposition at the reaction temperature mentioned above. It has also been found that a composite of a similar rectifying characteristic is also able to be manufactured using Ge or GaAs as a substrate material.

Figure 4D:
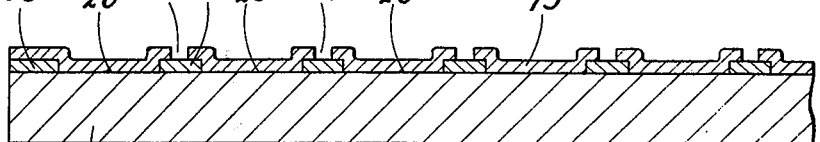

At the next step, as shown in FIG. 4D, the tin oxide film 13 is partially removed just at a portion where it is deposited on silicon dioxide film strips 17. These removed portions form separating portions 19 which divide the composite into a plurality of barrier regions 20. A photo-etching technique can be effectively utilized for dividing the tin oxide film 13 into a plurality of sections. The tin oxide, chemically stable as it is, is difficult to etch away. However, its etching can be accomplished with a relatively high precision by a process of first depositing a zinc layer where the $SnO_2$ film 13 to be removed by etching, dissolving it away with a dilute solution of hydrochloric acid for slight reduction of the surface of the tin oxide film 13, depositing a zinc layer again and then dissolving it away with concentrated hydrochloric acid together with a tin oxide layer underneath. Removal is made only of the $SnO_2$ film 13 just extending on the silicon dioxide film strips 17 running on the main surface of the substrate exclusive of the peripheral portion thereof, while the $SnO_2$ film 13 just overlying on the strip 18 at the peripheral portion of the substrate is left as it is.

Figure 4E:
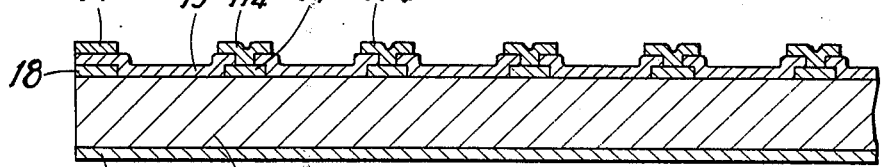

Electrodes 14, 114 and 15 are then formed on both main surfaces of the substrate, as shown in FIG. 4E. These electrodes 14, 114 and 15 are formed by depositing nickel by a vacuum evaporation method to a thickness of about 8,000 A. As will be apparent from FIG. 4E, the electrodes 14 and 114 occupy the area where the electrodes are to be eventually formed selectively in a part of tin oxide film 13 deposited on said insulating film strips 18 and 17, respectively. The electrodes 14 and 114 are formed by first depositing nickel all over the main surface of the substrate 11 and then removing the unnecessary part by a known method of photo-etching. The electrode 15 can be dispensed with where the substrate 11 is attached to a gold-plated stem support over a gold-silicon eutectic layer, for example. It was found that, as a material of the electrode to be formed on the tin oxide layer, nickel was one of the most preferred in view of its conductivity, adhesion to the layer, cost and soldering possibility, etc.

Since the electrodes 14 and 114 are formed outside the area in which the barrier 20 is formed, the entire barrier formed in the chip is effectively utilized in the photoelectric device. Pressure applied to the electrode 14 in attaching a lead wire thereto does not affect the rectifying characteristic. No barrier is formed underneath the electrode, which is deposited on a portion of the $SnO_2$ film 13 above the silicon dioxide film. Another advantage of the inventive composite of the shown embodiment is that it is stable under the influence of outside atmosphere for a long time, because the end portion of the barrier is defined and protected by the silicon dioxide film.

It is understood that the resultant composite in accordance with the present invention comprises a plurality of small square or rectangle light receiving barrier areas laid out at right angles, while separated from each other by the gap 19 formed on the strip insulating film 17 but connected in parallel with each other by means of the electrode 114, so that a composite of new structure having substantially the same light receiving barrier area as that of the prior art composite of broadened area in a single barrier region.

Figure 5:
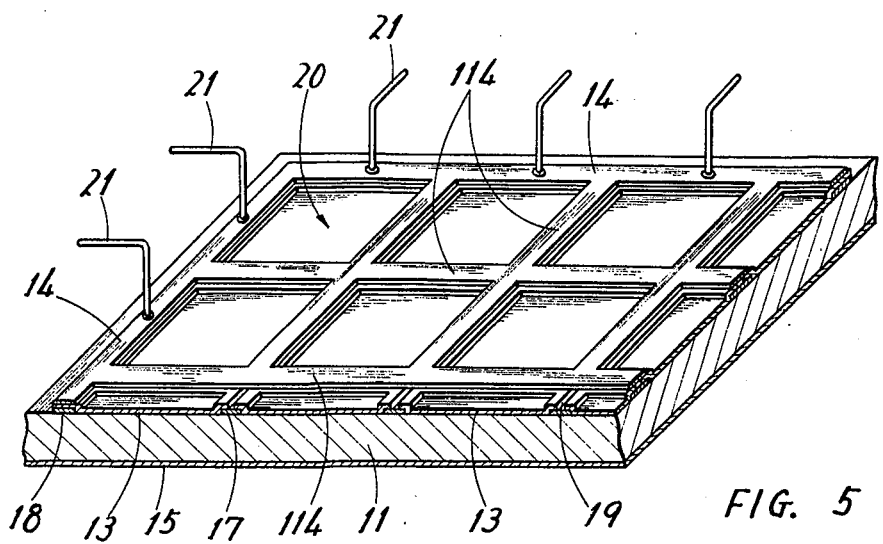
FIG. 5 is a perspective view of a fragmentary end portion of the inventive composite.

The whole structure of the composite of the present invention can be better seen in FIG. 5, which illustrates a perspective view of a fragmentary end portion of the inventive composite. The composite is also shown having a plurality of thin lead wires 21 attached to the peripheral electrode 14 of the composite. Wire bonding of the leads 21 will be described subsequently.

Now referring again to FIGS. 2 and 3, detailed description of various characteristics of the inventive device will be made in the following in comparison with those of the prior art composite.

As depicted previously, FIG. 2 illustrates a graph showing rectifying and photoelectric characteristics of the inventive device and the prior art device, as subjected to various values of illumination, these being shown as a parameter in the graph. Curves A as indicated in solid lines represent such characteristics of the inventive device, while Curves B as indicated in dotted lines represent such characteristics of the prior art device. The curves A were obtained using a composite of a structure as shown in FIG. 5 having a total light receiving area of 300 $mm^2$ comprised of a plurality of small 1 mm-square light receiving barrier areas and the curves B were obtained using a composite of a structure as shown in FIG. 1 having a light receiving area of 300 $mm^2$ formed in a single region. As seen from the graph, it is seen that the characteristics of the inventive device, as not biased or biased with a small value, is much improved as compared with those of the prior art device. Since the device of this type is usually used as not biased, the said difference of the characteristics will much enhance utility of the inventive device.

As briefly described previously, FIG. 3 illustrates a graph showing a relation between a reverse dark current and a light receiving area of the inventive device and the prior art device. Curves A and B indicated in solid lines represent the relation of the inventive device, while Curve C as indicated in a dotted line represents such a relation of the prior art device. The curve A was obtained using a composite of a structure as shown in FIG. 5 having a plurality of 1 × 1 $mm^2$ light receiving barrier areas and the curve B was obtained using a composite of a structure as shown in FIG. 5 having a plurality of 3 × 3 $mm^2$ light receiving barrier areas, while the curve C was obtained with a prior art composite of a structure as shown in FIG. 1, in which every composite is biased with a voltage of 1 volt in a reverse direction. As seen from the graph, it is observed that the reverse dark current of the inventive device is only increased in linear proportion to the light receiving barrier area thereof, while that of the prior art device is undesirably more increased.

The reason of improvement in the characteristics of the inventive device as mentioned above may be explained as follows. Division of the light receiving barrier area into a plurality of small areas with a gap intervening between each other eliminates tensile force exerted across the SnO₂ film and thus reduces a shearing stress applied at the barrier portion, with the result of reduction of a total of the reverse dark current of the inventive device as compared with that of the prior art, on the assumption of the same total light receiving barrier area. On the other hand, provision of the electrode 114 extending along the gap 19 between a plurality of small light receiving areas provides a current path of low resistance, with the result that series resistance through the SnO₂ layer throughout the device is reduced and thus the photoelectric characteristic of the device as not biased or biased with a small value is improved.

Figure 4F:
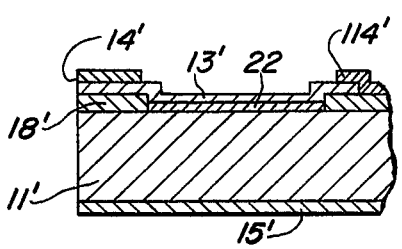
FIG. 4F is a sectional view of a semiconductor composite including an insulating material layer on the surface of the semiconductor substrate and onto which the tin oxide film forming the heterojunction with the substrate is formed.

In the foregoing, a preferred embodiment of the inventive device was described on the basis of the prior art semiconductor composite as disclosed in the referenced patent. As pointed out previously, the inventive device can also be implemented on the basis of the composite as disclosed in the referenced patent application. FIG. 4F shows a portion of a composite formed in accordance with the referenced patent application and, for convenience, only a segment thereof such as at the left-hand portion of the cross-sectional view of FIG. 4E, like elements of the composite being identified by identical, but timed numerals. Specifically, the composite of FIG. 4F includes additional insulating material layer 22 interposed between the tin oxide layer of 13' and the substrate 11'. In implementing the inventive device on the basis of the SnO₂-SiO₂-Si composite as disclosed in the referenced application, it is preferred to employ the insulating layer 18 of more than 20 A in thickness in view of the breakdown voltage and leakage current characteristics, but less than 27 A in thickness in view of the switching characteristic as described previously.

Figure 6:
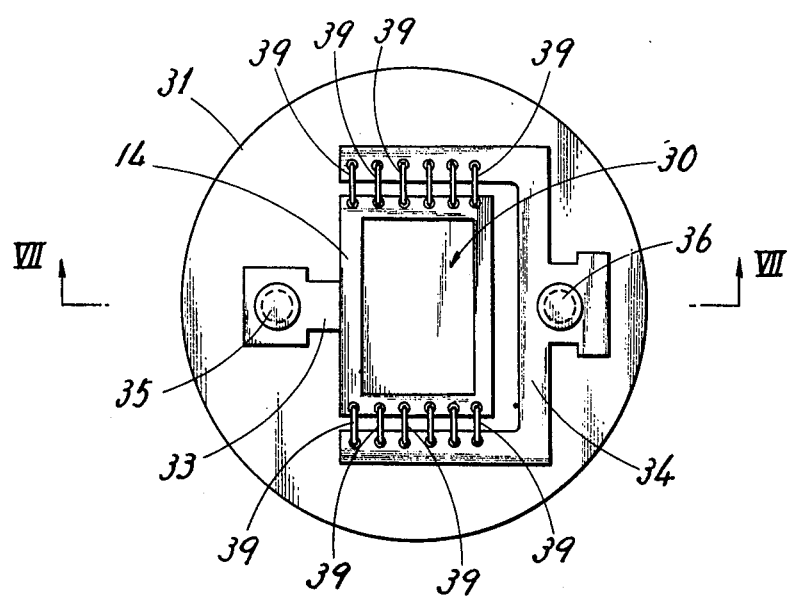
FIG. 6 is a top view of a preferred embodiment of stem mounting for mounting the inventive device.
Figure 7:
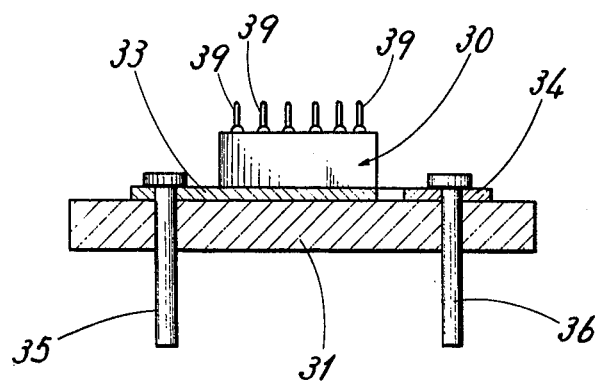
FIG. 7 is a sectional view of the stem mounting of FIG. 6 taken along the line VII—VII.

FIG. 6 shows a top view of a preferred embodiment of stem mounting for mounting the inventive device, while FIG. 7 shows a sectional view of the stem mounting of FIG. 6 taken along the line VII—VII. The device shown in FIGS. 6 and 7 comprises a stem base 31 of a disc plate made of ceramic and a semiconductor composite 30. The composite 30 may be the same as shown in FIG. 5. It is pointed out that for simplicity of illustration only the peripheral electrode 14 is illustrated in the composite in FIG. 6, while the electrode 114 has been omitted from illustration.

The stem 31 has a metal layer 33 of a rectangle pattern substantially the same as that of the composite chip 30, which layer is formed on the upper surface of the base 31 at the center thereof with an additionally extended layer, where a connector pin 35 is mounted extending vertically through the base 31 in contact with the layer 33. The composite chip 30 is fixed to the rectangle layer area 33. Formation of the metal layer 33 on the ceramic stem and fixing of the semiconductor composite chip 30 to the metal layer are well known to those skilled in the art. Another metal layer 34 of C-shaped pattern is similarly formed on the stem base 31 with a similar extended layer, where a connector pin 36 is mounted extending vertically through the base 31 in contact with the layer 34. It is seen from FIGS. 6 and 7 that the metal layer 34 extends around the metal layer 33 spaced apart therefrom so as to encompass the layer 33.

The electrode 14 and the metal layer 34 are connected, at the upper portion and the lower portion thereof, as viewed in FIG. 6, by means of a plurality of thin lead wires 39, preferably spaced apart uniformly, using a well known wire bonding process. It is recalled that one of the typical features of the semiconductor composite employed in the inventive device is formation of the SnO₂ layer at a relatively low temperature. The barrier thus formed between the SnO₂ layer and the semiconductor substrate of the resultant composite is subject to damage of the heterojunction and thus deterioration of the characteristics, particularly the open voltage characteristic by a high temperature. This means that it is impossible to effect connection by soldering in connecting the electrode 14 to the metal layer 34. Thus, it is concluded that ultrasonic bonding of a thin lead wire is most preferred for connecting the electrode 14 to the layer 34. An aluminum wire lead is advantageously used for this purpose. Nowadays, an aluminum wire lead of 100μ, 50μ and 25μ in diameter is commercially available. Taking into consideration the influence upon the heterojunction barrier, it is preferred to use a thinner lead wire. It is also recalled that the most preferred material for the electrode 14 is nickel. Therefore, series resistance across the electrode 14 is rather high. As a result, it is preferred to connect the electrode 14 to the layer 34 by using more number of thinner lead wires, so that the leads may be distributed spaced apart along the peripheral electrode 14 of the composite chip 30. In view of employment of such structure, the stem base 31 is preferably made of ceramic for readily providing an electrical insulation between the metal layers 33 and 34.

Figure 8:
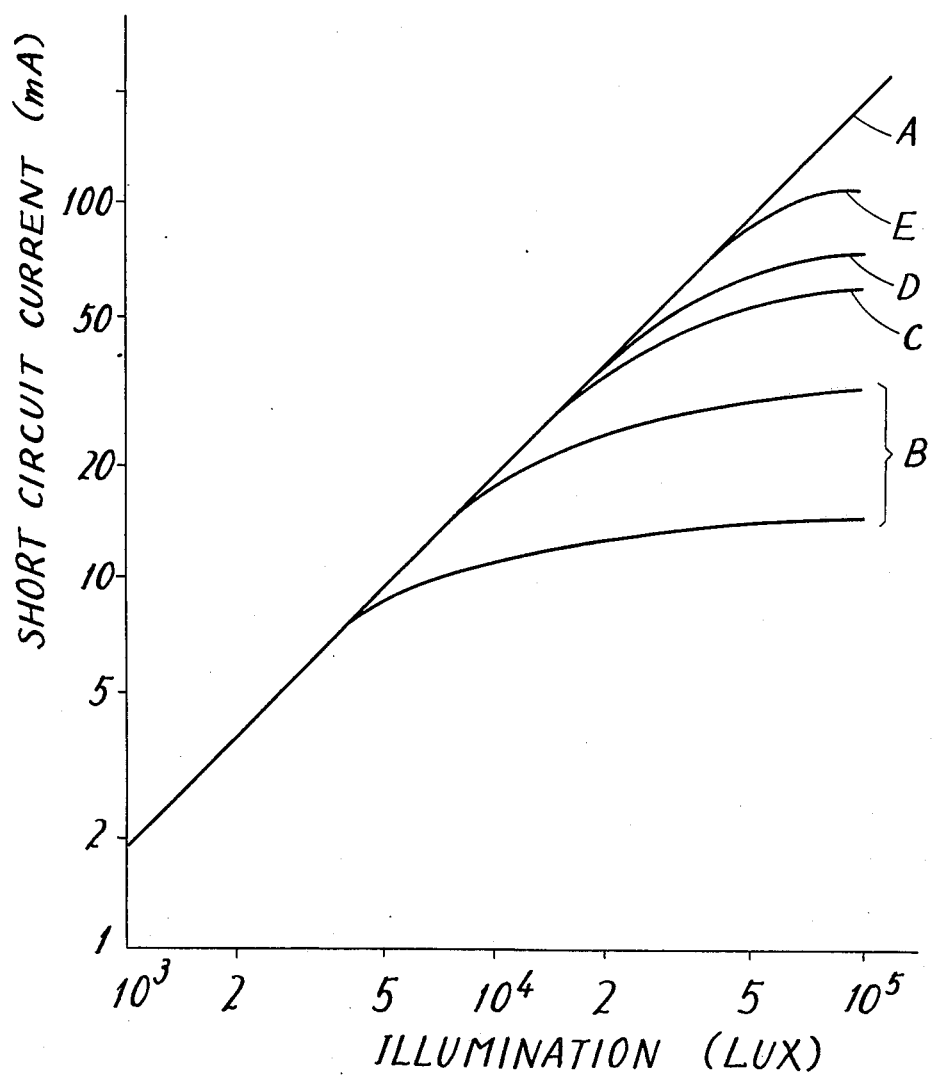
FIG. 8 is a graph showing a relation of the short circuit current with illumination of the inventive device in comparison with the prior art device.

FIG. 8 is a graph showing a relation of the short circuit current with illumination of the inventive device, in comparison with the prior art device. Curve E represents a characteristic of the device as shown in FIG. 6, curve D represents that of the device of FIG. 6 but with only a single lead wire used at the center of each of the upper and the lower portions of the electrode 14 and the layer 34, as viewed in FIG. 6, and curve C represents that of the device of FIG. 6 but with only a single lead wire used at the left end of each of the upper and the lower portions of the electrode 14 and the layer 34, as viewed in FIG. 6. Curves B show a similar characteristic of the device using the prior art composite as shown in FIG. 1 and curve A is an ideal curve.

Figure 8A:
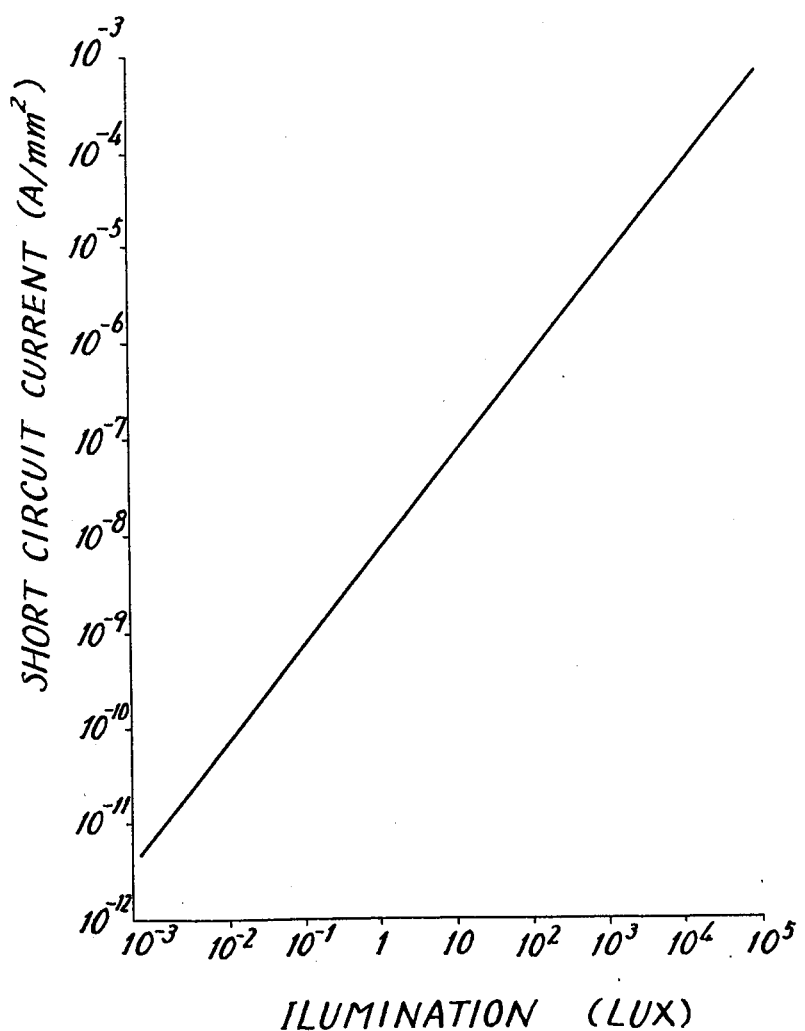
FIG. 8A is a graph showing a characteristic of the inventive device similar to that in FIG. 8 plotted over a wide range of illumination.

FIG. 8A is a graph showing a characteristic similar to that in FIG. 8, in which the characteristic curve of the inventive device has been plotted over so wide a range of illumination. In view of the characteristic, it is understood that the photoelectric device of the embodiment as shown in FIG. 6 can be advantageously used for responding to so wide a range of low to high illumination in a very linear manner.

Figure 9:
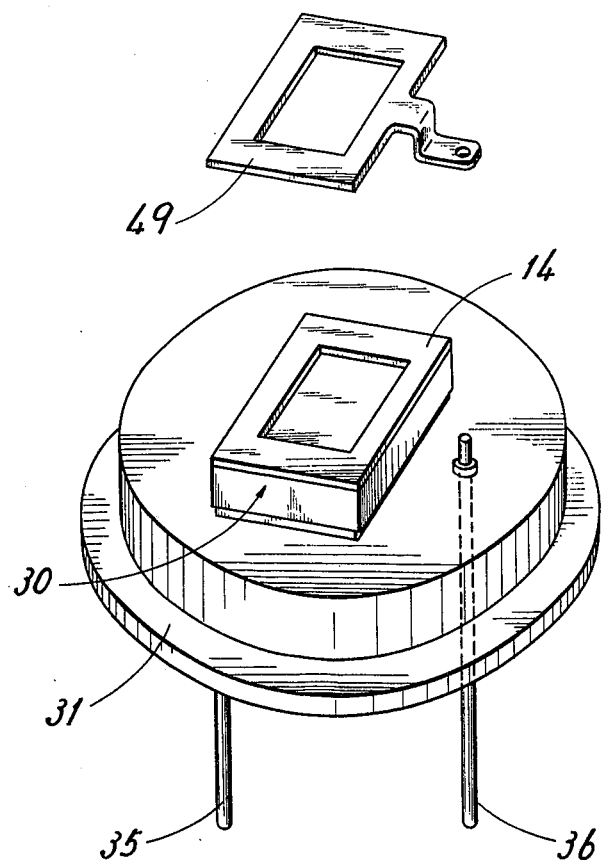
FIG. 9 is a perspective view of another embodiment of stem mounting for mounting the inventive device.

Another embodiment of stem mounting of the inventive device is shown in FIG. 9. In lieu of a plurality of wire leads 39 and the metal layer 34 of the FIG. 6 embodiment, the FIG. 9 embodiment uses a metal plate 49 having a configuration commensurate with that of the peripheral electrode 14 with an extended portion for connection to the connector pin 36. The other portions of the FIG. 9 device are substantially the same as those of the FIG. 6 embodiment and therefore detailed description thereof will be omitted. The metal plate 49 may be attached to the peripheral electrode 14 by pressure contact or soldering. It is apparent that such connection of the electrode 14 to the metal plate 49 might deteriorate the characteristic of the device, particularly the photoelectric characteristic of the device at low illumination. However, the FIG. 9 embodiment may be advantageously used for responding to high illumination.

While specific preferred embodiments of the invention have been described, it will be apparent that obvious variations and modifications of the invention will occur to those skilled in the art from a consideration of the foregoing description. It is therefore desired that the present invention be limited only by the appended claims.

What is claimed is:

1. A semiconductor photoelectric device of increased light receiving area for providing increased photoelectric output current comprising:
   a semiconductor substrate having a main surface,
   a plurality of tin oxide films deposited on said main surface of said semiconductor substrate, said tin oxide films being spaced apart from each other by a narrow spacing between peripheral portions of adjacent tin oxide films, whereby a corresponding plurality of heterojunction barriers, each having a rectifying characteristic, is formed between said tin oxide films and said substrate, said narrow spacings between said tin oxide films reducing stresses at the respective barriers thereof,
   means comprising a metal layer forming an electrically common connection to the separate tin oxide films, said metal layer being formed to include portions respectively extending along each said spacing and in electrical contact with the peripheral portions of all of said adjacent tin oxide films, thereby permitting incident light to be received by said tin oxide films,
   an insulator on said substrate and extending at least within said narrow spacings for maintaining said metal layer in spaced, insulated relationship from said substrate, and
   means for withdrawing a photoelectric conversion output from between said semiconductor substrate and said connecting means.

2. The semiconductor photoelectric device in accordance with claim 1, further comprising an insulating material layer formed between each said tin oxide film and said substrate and defining a corresponding heterojunction barrier.

3. The semiconductor photoelectric device in accordance with claim 2, in which said insulating material is incidentally formed.

4. The semiconductor photoelectric device in accordance with claim 2, in which said insulating material is a semiconductor reaction product.

5. The semiconductor photoelectric device in accordance with claim 4, in which said insulating material is $SiO_2$, $Si_3N_4$ or $GeO_2$.

6. The semiconductor photoelectric device in accordance with claim 4, in which said insulating material is $SiO_2$.

7. The semiconductor photoelectric device in accordance with claim 6, in which the thickness of said insulating material layer is chosen to be in the range of from 15 A to 500 A.

8. The semiconductor photoelectric device in accordance with claim 6, in which the thickness of said insulating material layer is chosen to be in the range of from 20 A to 27 A.

9. The semiconductor photoelectric device in accordance with claim 1, in which said semiconductor substrate is Si, Ge or GaAs.

10. The semiconductor photoelectric device in accordance with claim 1, in which said semiconductor substrate is Si.

11. The semiconductor photoelectric device in accordance with claim 1, in which said semiconductor substrate is N-type conductivity Si.

12. The semiconductor photoelectric device in accordance with claim 1, in which said metal layer comprises nickel.

13. The semiconductor photoelectric device in accordance with claim 1 wherein said insulator comprises an insulating material film of a substantial thickness deposited on said main surface of the semiconductor substrate, said insulating material film having a plurality of openings therein to expose the underlying main surface of said substrate, said heterojunction barriers thus formed being defined at the peripheral portions thereof by said openings.

14. The semiconductor photoelectric device in accordance with claim 13, in which said narrow spacing between said peripheral portions of said tin oxide films is formed on said insulating material film.

15. The semiconductor photoelectric device in accordance with claim 13, in which said insulating material is a semiconductor reaction product.

16. The semiconductor photoelectric device in accordance with claim 15, in which said insulating material is $SiO_2$, $Si_3N_4$ or $GeO_2$.

17. The semiconductor photoelectric device in accordance with claim 15, in which said insulating material is $SiO_2$.

18. The semiconductor photoelectric device in accordance with claim 15, in which said metal layer connecting means is provided on said insulating material film.

19. The semiconductor photoelectric device in accordance with claim 18, which further comprises a peripheral metal layer deposited on said insulating material film extending along the periphery of said substrate, said peripheral metal layer being in contact with said metal layer connecting means.

20. The semiconductor photoelectric device in accordance with claim 19, in which said narrow spacings between said peripheral portions of said tin oxide films extend at right angles.

21. The semiconductor photoelectric device in accordance with claim 20, in which the metal of said peripheral metal layer is nickel.

22. The semiconductor photoelectric device in accordance with claim 1, which further comprises a stem means for mounting said semiconductor composite.

23. The semiconductor photoelectric device in accordance with claim 22, which further comprises a peripheral metal layer deposited on the substrate extending along the periphery thereof, and insulated therefrom; said peripheral metal layer being in contact with said metal layer connecting means.

24. The semiconductor photoelectric device in accordance with claim 23, which further comprises
   a conductor layer deposited on said stem extending around and spaced from said semiconductor composite, and
   connection means for connecting said peripheral metal layer to said conductor layer.

25. The semiconductor photoelectric device in accordance with claim 24, in which said connection means comprises a lead wire bonded to said peripheral metal layer.

26. The semiconductor device in accordance with claim 24, in which said connection means comprises a plurality of lead wires bonded to said peripheral metal layer.

27. The semiconductor photoelectric device in accordance with claim 24, in which said connection means comprises a lead wire thinner than 100μ in diameter bonded to said peripheral metal layer.

28. The semiconductor photoelectric device in accordance with claim 23, which further comprises a conductive frame member in contact with said peripheral metal layer.

29. The semiconductor photoelectric device in accordance with claim 1, which further comprises a voltage source for supplying a reverse bias between said tin oxide layer and said semiconductor substrate in a reverse direction with respect to the rectifying characteristic of the composite.

30. A process for manufacturing a photoelectric semiconductor device of increased light receiving area for providing increased photoelectric output currents comprising the steps of:
   a. providing a semiconductor substrate having a main surface;
   b. forming a substantially uniform electrically insulating film on the semiconductor substrate main surface;
   c. exposing a plurality of rectilinear areas on the semiconductor substrate by removing the insulating film in preselected areas;
   d. depositing a film of tin oxide on the exposed rectilinear areas and on the remaining portions of said insulating film and removing portions of said tin oxide film deposited on the remaining portions of said insulating film to define plural said tin oxide films with the peripheries thereof on the said remaining portions of said insulating films, the peripheries of adjacent said tin oxide films being spaced apart from one another by a narrow spacing with the insulating film extending underneath, said narrow spacings between said tin oxide films reducing stresses at the respective barriers thereof;
   e. depositing electrodes onto the said peripheries of the said tin oxide films over the insulating films for electrically connecting said tin oxide films in common; and
   f. providing means connected to said electrodes and said substrate for withdrawing a photoelectric conversion output from said device.

31. The method of claim 30 wherein said portions of said tin oxide film are removed by:
   depositing a zinc layer over the tin oxide film in those portions to be removed; and
   etching the tin oxide film and the zinc layer for removing both thereof.

32. A process according to claim 30 wherein:
   a metal electrode is deposited on the insulating film along with periphery of said substrate, and wherein a plurality of thin lead wires are bonded to the peripheral electrode.

33. A semiconductor photoelectric device of increased light receiving area for providing increased photoelectric output current comprising:
   a semiconductor substrate having a main surface,
   a rectilinear grid of electrically insulating material formed on the main surface, said insulating material having substantially uniform thickness and defining a plurality of open areas on the main surface;
   a plurality of separate tin oxide films deposited over the open areas, each of said tin oxide films being disposed with peripheral portions partially overlapping the insulating material grid, thereby providing a narrow spacing between adjacent tin oxide films along the rectilinear grid whereby a plurality of heterojunction barriers are formed between the tin oxide films and said semiconductor substrate, each having a rectifying characteristic, said narrow spacings between said tin oxide films reducing stresses at the respective barriers thereof;
   electrode means for electrically connecting the adjacent tin oxide films in common, said electrode means being substantially coextensive with the rectilinear grid of insulating material, extending along said narrow spacings and in electrical contact with the peripheral portions of the tin oxide films, whereby substantially the entire area of each heterojunction barrier formed between the tin oxide films and the substrate remains exposed for receipt of incident light; and
   means connected to said electrode means and said substrate for withdrawing a photoelectric output in common from said plural heterojunction barriers formed between said semiconductor substrate and said plural tin oxide films.

34. The device of claim 33 wherein said substrate consists essentially of P-type silicon.

35. The device in claim 33 comprising means for supplying a reverse bias voltage between said tin oxide films and said substrate in a reverse direction with respect to the rectifying characteristic of said device.

36. The semiconductor photoelectric device in accordance with claim 33, in which an insulating material layer is formed between each said tin oxide film and said substrate defining a corresponding heterojunction barrier.

37. The semiconductor photoelectric device in accordance with claim 36, in which said insulating material is incidentally formed.

38. The semiconductor photoelectric device in accordance with claim 36, in which said insulating material is a semiconductor reaction product.

39. A semiconductor photoelectric device in accordance with claim 38, in which said insulating material is $SiO_2$, $Si_3N_4$ or $GeO_2$.

40. The semiconductor photoelectric device in accordance with claim 38, in which said insulating material is $SiO_2$.

41. The semiconductor photoelectric device in accordance with claim 40, in which a thickness of said insulating material layer is chosen to be 15 A to 500 A.

42. The semiconductor photoelectric device in accordance with claim 40, in which a thickness of said insulating material layer is chosen to be 20 A to 27 A.

* * * * *

UNITED STATES PATENT AND TRADEMARK OFFICE
CERTIFICATE OF CORRECTION

PATENT NO. : 4,005,468
DATED : January 25, 1977
INVENTOR(S) : Shigeru Tanimura et al It is certified that error appears in the above-identified patent and that said Letters Patent are hereby corrected as shown below:

Column 15, line 1, after "semiconductor" insert --photoelectric--.

Column 15, line 63, change "with" to --the--.

Column 16, line 38, change "in" to --of--.

Signed and Sealed this

Twenty-fourth Day of May 1977

[SEAL]

Attest:

RUTH C. MASON
*Attesting Officer*

C. MARSHALL DANN
*Commissioner of Patents and Trademarks*